US006821682B1

(12) United States Patent
Stearns et al.

(10) Patent No.: US 6,821,682 B1
(45) Date of Patent: Nov. 23, 2004

(54) REPAIR OF LOCALIZED DEFECTS IN MULTILAYER-COATED RETICLE BLANKS FOR EXTREME ULTRAVIOLET LITHOGRAPHY

(75) Inventors: Daniel G. Stearns, Los Altos, CA (US); Donald W. Sweeney, San Ramon, CA (US); Paul B. Mirkarimi, Sunol, CA (US)

(73) Assignee: The EUV LLC, Santa Clara, CA (US)

( * ) Notice: Subject to any disclaimer, the term of this patent is extended or adjusted under 35 U.S.C. 154(b) by 181 days.

(21) Appl. No.: 09/669,390

(22) Filed: Sep. 26, 2000

(51) Int. Cl.[7] .............................................. G03F 9/00
(52) U.S. Cl. .......................................................... 430/5
(58) Field of Search ............................... 430/5; 378/34, 378/35; 428/428; 250/492.21, 492.22, 492.3; 204/192.1, 192.34

(56) References Cited

U.S. PATENT DOCUMENTS

| 5,052,033 A | | 9/1991 | Ikeda et al. ................... 378/35 |
| 5,272,744 A | | 12/1993 | Itou et al. ....................... 378/35 |
| 5,503,950 A | * | 4/1996 | Miyake et al. .................. 430/5 |
| 5,549,994 A | | 8/1996 | Watanabe et al. ............... 430/5 |
| 6,165,649 A | * | 12/2000 | Grenon et al. .................. 430/5 |
| 6,352,803 B1 | * | 3/2002 | Tong et al. ..................... 430/5 |

FOREIGN PATENT DOCUMENTS

EP        0 279 670 A2    8/1988

* cited by examiner

Primary Examiner—S. Rosasco
(74) Attorney, Agent, or Firm—John P. Wooldridge; Alan H. Thompson

(57) ABSTRACT

A method is provided for repairing defects in a multilayer coating layered onto a reticle blank used in an extreme ultraviolet lithography (EUVL) system. Using high lateral spatial resolution, energy is deposited in the multilayer coating in the vicinity of the defect. This can be accomplished using a focused electron beam, focused ion beam or a focused electromagnetic radiation. The absorbed energy will cause a structural modification of the film, producing a localized change in the film thickness. The change in film thickness can be controlled with sub-nanometer accuracy by adjusting the energy dose. The lateral spatial resolution of the thickness modification is controlled by the localization of the energy deposition. The film thickness is adjusted locally to correct the perturbation of the reflected field. For example, when the structural modification is a localized film contraction, the repair of a defect consists of flattening a mound or spreading out the sides of a depression.

21 Claims, 6 Drawing Sheets

Figure 1 Temperature profile for a Mo/Si multilayer film on a Si substrate heated by an electron beam having a current and voltage of 3 μA and 10 kV, respectively. The electron beam is incident on the top left corner and has a radius of 25 nm.

FIG. 1A
(a)
FIG. 1B
Focused Beam
(b) ↓ ~10
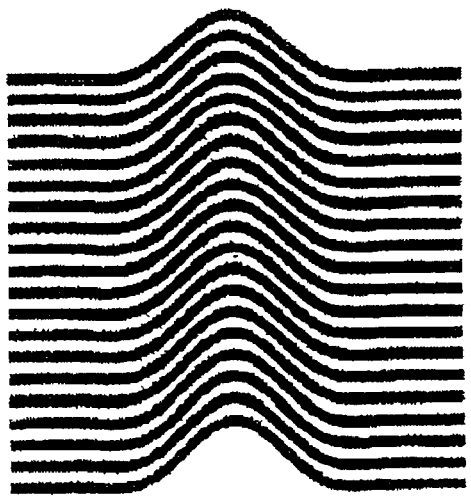
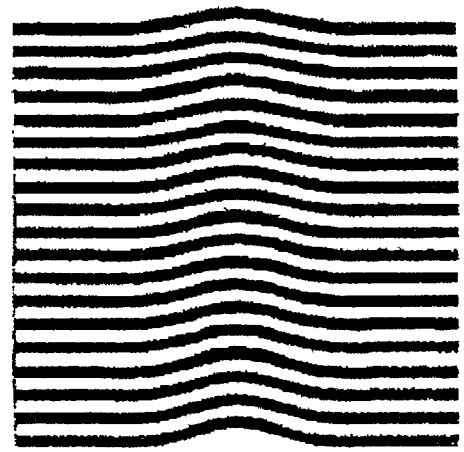

Figure 1 Temperature profile for a Mo/Si multilayer film on a Si substrate heated by an electron beam having a current and voltage of 3 µA and 10 kV, respectively. The electron beam is incident on the top left corner and has a radius of 25 nm.

Figure 2 Temperature at the top surface (z = 280 nm) of the multilayer film as a function of radial position for heating via an electron beam.

Figure 3 Temperature at the center of the electron beam (r = 0) as a function of depth in the multilayer film. The total thickness of the film is 280 nm.

Figure 7 Contour plot showing the width w of the silicide interlayer within the Mo/Si multilayer film after an electron beam exposure of 10 ms. The width varies from the as-deposited value of $w_0 = 1.0$ nm to a maximum value of 2.48 nm in the center of the electron beam.

REPAIR OF LOCALIZED DEFECTS IN MULTILAYER-COATED RETICLE BLANKS FOR EXTREME ULTRAVIOLET LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to minimizing defects in the components produced by an extreme ultraviolet lithography (EUVL) system, and more specifically, it relates to a method for repairing defects in the multilayer coating of an EUVL reticle.

2. Description of Related Art

The reticle blank to be used in an extreme ultraviolet lithography (EUVL) system is expected to consist of a thick substrate coated with a reflective multilayer film. This multilayer film is subsequently covered with a patterned absorber layer to form the EUVL reticle. See C. W. Gwyn, R. Stulen, D. Sweeney, and D. Attwood, "Extreme Ultraviolet Lithography", J. Vac. Sci. Technol. B 16, 3142 (1998). When the reflective multilayer coating is deposited on substrate imperfections such as particles, pits or scratches, the layer structure of the multilayer film is perturbed, resulting in mounds or depressions in the contour of the layers. See P. B. Mirkarimi, S. Bajt, and D. G. Stearns, "Mitigation of Substrate Defects in Reticles Using Multilayer Buffer Layers", U.S. patent application Ser. No. 09/454,715 now U.S. Pat. No. 6,319,635, incorporated herein by reference. These defects produce unacceptable intensity variations in the lithographic image when they exceed a lateral dimension of about 30 nm, and a height variation of more than about 1 nm. See T. Pistor, Y. Deng, and A. Neureuther, "Extreme Ultraviolet Mask Defect Simulation—Part II", J. Vac. Sci. Technol. B, to be published in the November/December 2000 issue.

The above-incorporated patent application proposes using buffer layers to mitigate the growth of multilayer phase defects from small substrate particles and features that cannot be detected by standard inspection tools. The buffer layer concept exploits the smoothing properties of specially designed films to reduce the size of the substrate perturbations to a level at which they will not nucleate a critical (i.e., printable) phase defect in the multilayer reflective coating. Although this approach should greatly reduce the population of phase defects, it must be expected that a few critical phase defects will always be present. These could arise, for example, from the contamination of the top surface of the buffer layer. Hence it is essential that a process be developed for repairing a small number of phase defects in the Mo/Si multilayer reflective coating on a EUVL mask. The problem with repairing the multilayer reflective coating is that it is fundamentally incompatible with the current mask repair technology. The current technology involves repairing defects in the metal absorber layer by locally removing or depositing material; however, the repair of the multilayer film must consist of correcting the local deformation of the layers within the film.

U.S. Pat. No. 5,272,744, titled "Reflection Mask", by M. Itou, H. Oizurm, and S. Moriyama, granted Dec. 21, 1993 (Itou et al.) describes a special reticle for x-ray and extreme ultraviolet lithography that is provided to facilitate the repair of multilayer defects. This reticle comprises two multilayer film stacks separated by an Au layer and is in contrast to the conventional reticle design incorporating patterned absorber layers on a multilayer film or the other design of a patterned multilayer on an absorber. (See also U.S. Pat. No. 5,052,033 titled "Reflection Type Mask" by T. Ikeda et al.) There are some disadvantages to the Itou et al. approach, including (i) their reticle is more difficult and expensive to fabricate than other designs, (ii) the introduction of the Au layer will likely introduce additional roughness in the reflective overlayer, reducing the reflectance and throughput of the lithography system, (iii) their repair process is not a local one and involves covering the entire reticle blank with resist, etc., which could lead to new particulates/defects, and (iv) it is uncertain whether their method will work in a practical sense since it requires extreme control of the Au deposition and various etching processes so that a phase defect does not result from the multilayer defect repair process.

It is desirable that techniques be provided for the repair of multilayer film defects in reticles for use in extreme ultraviolet lithography.

SUMMARY OF THE INVENTION

It is an object of the present invention to provide a method for repairing defects in a multilayer coating that is deposited onto a reticle blank used in an extreme ultraviolet lithography (EUVL) system.

Other objects of the invention will be apparent to those skilled in the art based on the teachings herein.

A localized energy source is used for depositing energy in a multilayer coating of a reticle blank. The energy is deposited in the vicinity of the defect in a controlled manner and with high lateral spatial resolution. This can be accomplished using a focused electron beam, focused ion beam, focused electromagnetic radiation or through direct contact with an electrode. If the multilayer comprises an appropriate material combination, the absorbed energy will cause a structural modification (e.g., interdiffusion at the layer boundaries), producing a localized change in the film thickness. By adjusting the energy dose, the change in film thickness can be controlled with sub-nanometer accuracy. Localization of the energy deposition controls the lateral spatial resolution of the thickness modification. The film thickness is adjusted locally to correct the perturbation of the reflected field. For example, in the case where the structural modification is a contraction of the film, the repair of a defect consists of flattening a mound or spreading out the sides of a depression. The defect repair can be applied directly to the reflective multilayer coating or to a buffer layer consisting of a multilayer film deposited below the reflective multilayer. Finite element simulations for the case of an electron beam impinging on a Mo/Si multilayer film indicate that this is a viable defect repair technique for EUVL reticle blanks.

This invention has the potential to impact current extreme ultraviolet lithography (EUVL) system development and to impact government programs such as ASCII. There is a strong commercial driving force for increased miniaturization in electronic devices, and hence an extreme ultraviolet lithography (EUVL) tool has significant commercial potential. To be economically viable, this technology requires a nearly defect-free reticle. Commercial integrated circuit manufacturers currently rely on defect repair techniques to obtain reticles with sufficiently low defect densities; however, these repair techniques cannot be applied to EUVL reticles.

BRIEF DESCRIPTION OF THE DRAWINGS

FIG. 1A shows a multilayer film before exposure to a focused beam.

FIG. 1B shows a multilayer film after exposure to a focused beam.

DETAILED DESCRIPTION OF THE INVENTION

The present invention is a method to repair defects in the multilayer-coated reticles used in extreme ultraviolet lithography systems. The method consists of depositing energy in the multilayer coating in the vicinity of the defect with high lateral spatial resolution. This can be accomplished using a focused electron beam, focused ion beam, focused electromagnetic radiation or through direct contact with an electrode. If the multilayer film consists of Mo/Si or another appropriate material combination, the absorbed energy will cause a structural modification, producing a localized change in the film thickness. An appropriate material combination would be defined by materials that undergo structural modification at elevated temperatures that results in a local change in density. This could be due to the formation of a compound, as in the case of Mo/Si, or could be simply a phase transformation. Note that either an increase or decrease in the density is useable. Mo/Si has an increase in density, thereby producing a film contraction. If the density decreases upon heating then the invention would be used to expand the film in the region of valleys and smooth the edges in the region of hills. The localized change in the film thickness is illustrated schematically in FIGS. 1A and 1B, which show the multilayer film before (FIG. 1A) and after (FIG. 1B) exposure to the focused beam 10 in the case where the structural modification is a contraction. The change in film thickness can be controlled with sub-nanometer accuracy by adjusting the energy dose. The lateral spatial resolution of the thickness modification is controlled by the localization of the energy deposition. The film thickness is adjusted locally to correct the perturbation of the reflected field. For example, in the case where the structural modification is a local contraction of the film, the repair of a defect consists of flattening a mound or spreading out the sides of a depression. The defect repair can be applied directly to the reflective multilayer coating or to a buffer layer consisting of a multilayer film deposited below the reflective multilayer. This invention can be used to repair multilayer defects in reticle blanks or in fully patterned reticles, since the highest temperature used in the repair process can be maintained well below the melting temperature of the metal absorber layer.

Figure 2:
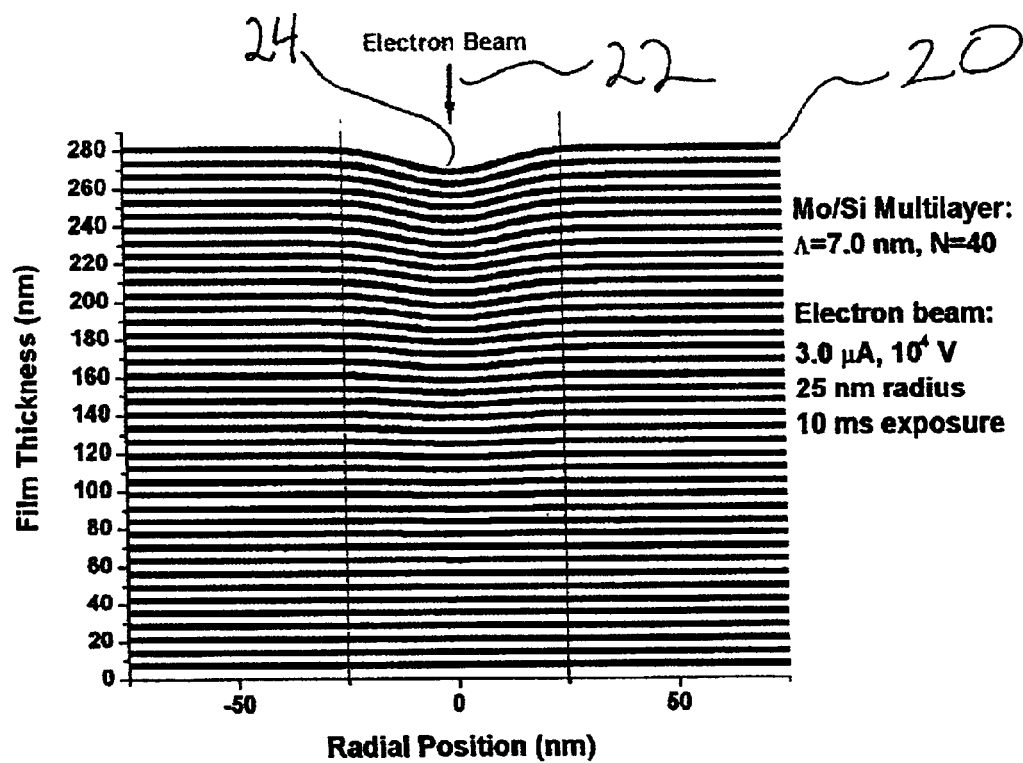
FIG. 2 shows the results of a finite element simulation of the deformation of a Mo/Si multilayer film.
Figure 3:
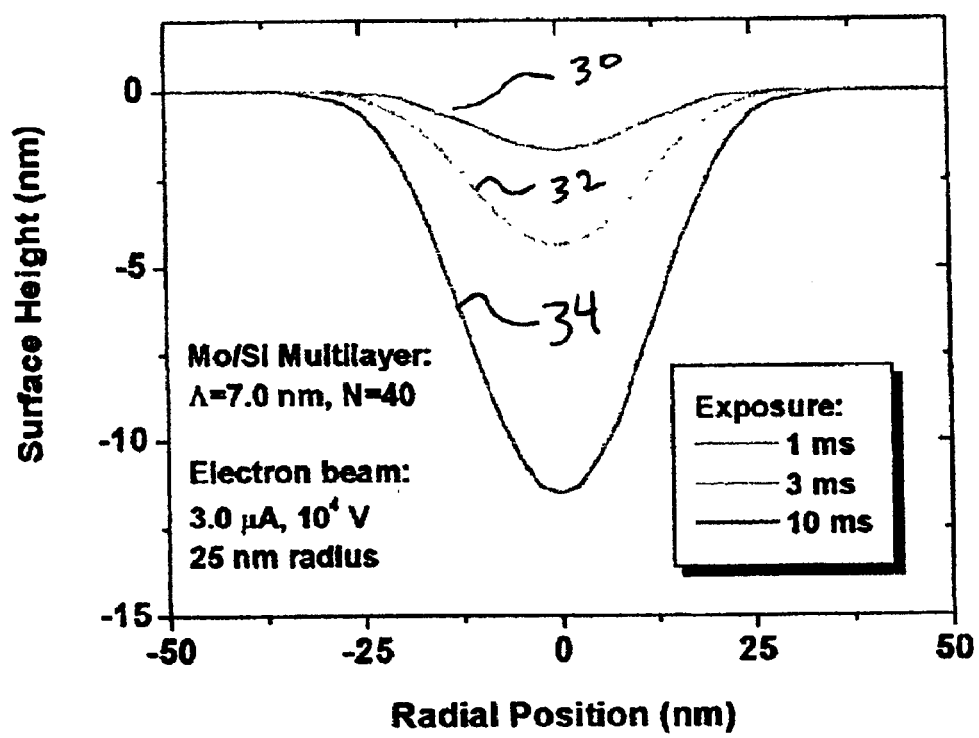
FIG. 3 illustrates that the size of a depression at the multilayer surface can be controlled by controlling the exposure time.

In order to assess the viability of the present invention, finite element simulations were performed for the case of an electron beam impinging on a localized area of a Mo/Si multilayer film. In this case the structural modification is a local contraction of the multilayer period due to silicide formation, which produces an indentation in the film in the vicinity of the electron beam. FIG. 2 shows the results of a finite element simulation of the deformation of a Mo/Si multilayer film 20 produced by a 10 msec exposure to an electron beam 22 of radius 25 nm, energy 10 kV, and current 3 □A. The depression at the surface is 12 nm, yet the contraction of each multilayer period is only 0.5 nm. This modification of the multilayer structure can be used to correct the phase of the reflected field without significantly altering the reflected amplitude. The size of the depression at the surface can be controlled by controlling the exposure time, as shown in FIG. 3. The lines at 30, 32 and 34 represent exposure times of 1 ms, 3 ms and 10 ms respectively. More information on these simulations is described below.

More specifically, finite element analysis was used to simulate the temperature increase in a Mo/Si multilayer film due to the injection of current by an electron beam. The calculations were performed using the commercial FlexPDE software sold by PDE Solutions, Inc. See www.pdesolutions.com. The Mo/Si multilayer film was modeled in cylindrical coordinates (2D) as a disk of thickness 280 nm and radius 10 µm on a Si substrate of thickness 1.12 µm. The multilayer film, which actually is composed of 40 Mo/Si periods each having a thickness of 7.0 nm, was treated as a single isotropic film for the purpose of the FEM modeling. The material properties of the Mo/Si film and the Si substrate are listed in Table I.

TABLE I

Values for the thermal conductivity K, the mass density p, the specific heat cp and the conductivity σ used in the FEM modeling.

| Material | □ (W/cm-° K) | □ (gm/cm³) | $c_P$ (J/gm-° K) | σ(1/Ω-cm) |
| --- | --- | --- | --- | --- |
| Mo/Si ML Film | 1.45 | 5.48 | 0.53 | $1 \times 10^4$ |
| Si substrate | 1.49 | 2.33 | 0.71 | 1 |

The time-dependent temperature profile T(r,z;t) within the multilayer film was determined by solving the thermal diffusion equation:

$$\frac{1}{r}\frac{\partial}{\partial r}\left(\kappa \frac{\partial T}{\partial r}\right) + \frac{\partial}{\partial z}\left(\kappa \frac{\partial T}{\partial z}\right) - \rho c_P \frac{\partial T}{\partial t} + H(r, z; t) = 0 \quad (1)$$

Here H is the heat source. The electron beam voltage was chosen to be sufficiently high (10 kV) so that the electron range would approximately match the thickness of the multilayer film. Then it was assumed that the energy was deposited uniformly through the film, within a cylinder of radius r0=25 nm. (This oversimplified picture neglects the scattering of the electrons within the film, which could be significant). In this model the heat deposited by the electron beam per unit volume was given by, $$H = \frac{IV}{\pi r_0^2 \tau} \quad (2)$$

Here I and V are the respective current and voltage of the electron beam and τ is the thickness of the multilayer film.

The time required for heat to diffuse a distance x is given by $x^2 \rho c_P / \kappa$. Inserting the values from Table I, it is seen that heat diffuses a micron in 20 ns. Hence, over the physical dimensions of this problem, the transient temperature dependence only lasts for tens of nanoseconds. Since such short timescales are not of interest, Eq. (1) was simplified by dropping the dT/dt term and just solved for the steady state temperature profile. The boundary conditions used in the calculations were that the bottom and sides of the substrate and the sides of the multilayer film were maintained at a constant ambient temperature of 300° K. These surfaces were also defined to be electrical ground (V=0). The top surface of the multilayer film was assumed to be thermally insulated (i.e., radiative cooling was neglected).

Figure 4:
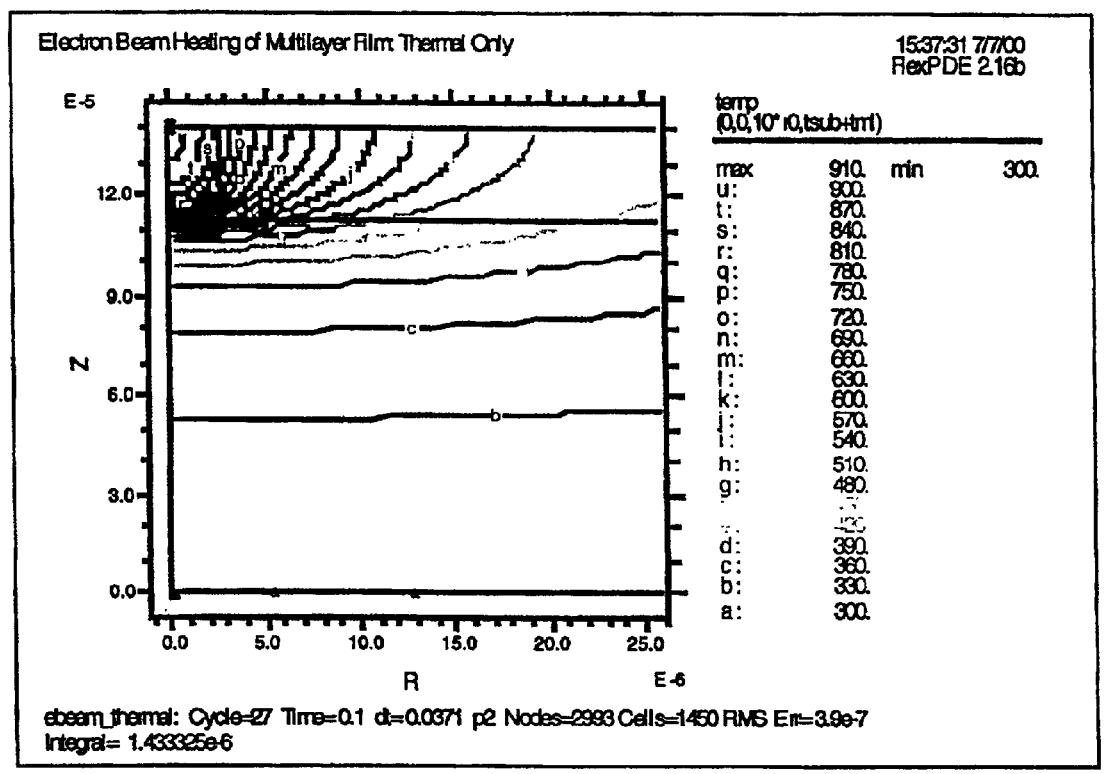
FIG. 4 shows the temperature profile obtained for an electron beam of current I=3 µA and voltage V=10 kV.
Figure 5:
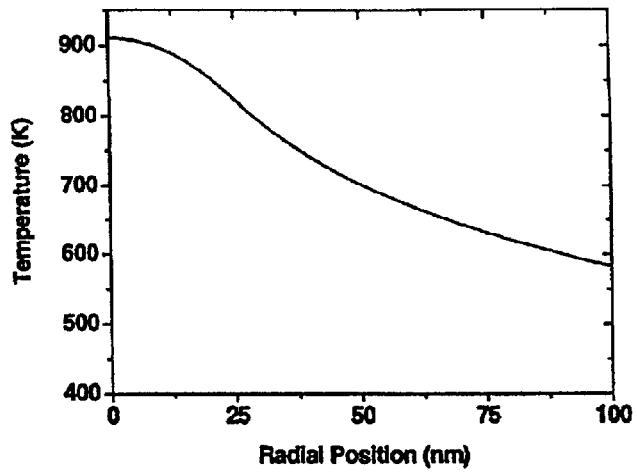
FIG. 5 is a plot of the temperature as a function of radial position on the top surface of the multilayer.
Figure 6:
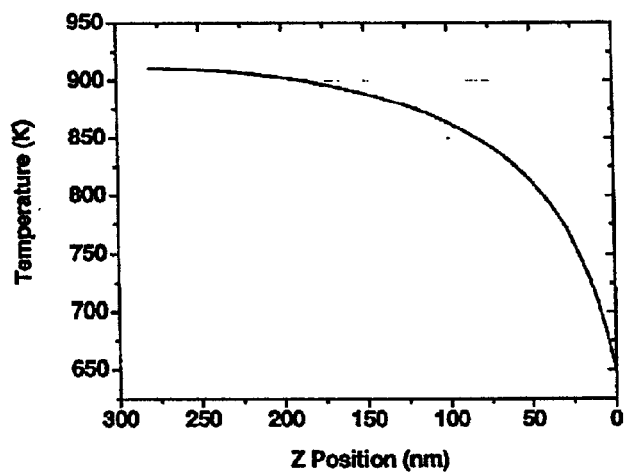
FIG. 6 shows the variation of temperature as a function of depth z at the center of the electron beam (r=0).

The current density was adjusted to produce peak temperatures sufficiently high (>800° K) to activate the silicide formation that causes the contraction of the multilayer film. The temperature profile obtained for an electron beam of current I=3 $\mu$A and voltage V=10 kV is shown in FIG. 4. The temperature on the top surface is plotted in FIG. 5 as a function of radial position. The variation of temperature as a function of depth z at the center of the electron beam (r=0) is plotted in FIG. 6. It can be seen that the temperature has a maximum value of 910° K at the top surface and decreases only to 880° K half way through the thickness of the film. Hence the heating is fairly uniform in depth due to the penetration of the electron beam. FIG. 5 shows that the temperature falls off rapidly in the radial direction, reducing to 700° K within 50 nm of the center of the electron beam.

Once the temperature profile is known, it is straightforward to calculate the contraction of the multilayer film due to silicide formation. The reaction of Mo and Si at the interfaces is rate limited by thermally activated interdiffusion (See "Silicide Layer Growth Rates in Mo/Si Multilayers", R. S. Rosen, D. G. Stearns, M. A. Viliardos, M. E. Kassner, S. P. Vernon and Y. Cheng, Appl. Optics 32,6975 (1993), incorporated herein by reference.) The width of the interlayer increases with time according to:

$$w^2 = w_0^2 + 2Dt \quad (3)$$

Here $w_0$=1.0 nm is the starting thickness of the interlayers in as-deposited films. The interdiffusion coefficient D is given by, $$D = D_0 \exp(-E_A/kT) \quad (4)$$

Where $D_0$=50 cm$^2$/s and $E_A$=2.4 eV for Mo/Si multilayer films. The formation of the silicide interlayer involves densification that leads to a contraction of the multilayer period. The local change in the period is given by, $$\Delta\Lambda = \Lambda_0 - \alpha(w - w_0) \quad (5)$$

Here $\alpha$ is the contraction factor that depends on the particular silicide compound that is formed. In this study, $\alpha$=0.38 is used, which corresponds to the contraction that occurs upon the formation of MoSi$_2$.

Figure 7:
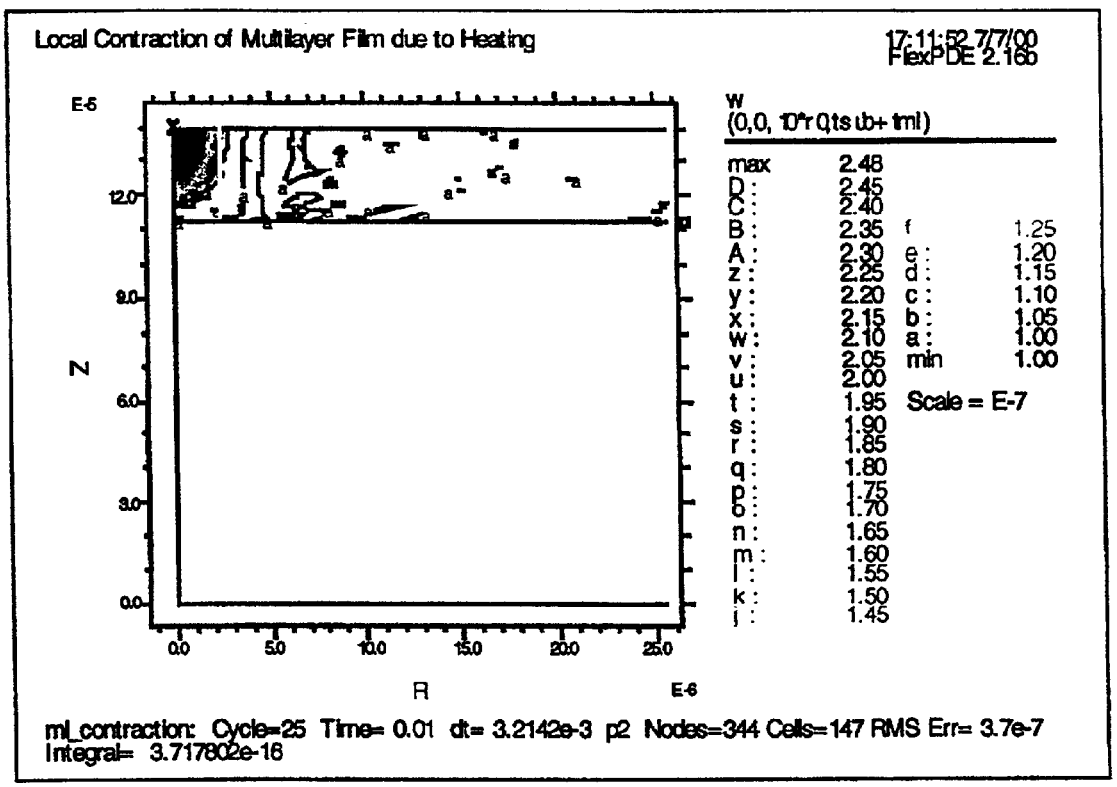
FIG. 7 shows a contour plot of the thickness of the silicide interlayer after an electron beam exposure of 10 ms.

The growth of the silicide interlayer has an approximately square root dependence on the time that the film is subjected to heating, which will be referred to as the exposure time. Note that because the thermal response is so rapid, the transient heating and cooling times can be neglected. Contour plots showing the thickness of the silicide interlayer after an exposure of 10 ms are presented in FIG. 7 for the case of electron beam heating. The interlayer has a maximum thickness at the surface of the film in the center of the current injection (r=0), and is approximately twice as thick as the as-deposited interlayer. It is evident that the electron beam creates significant interlayer growth nearly half way through the entire thickness of the film. This is of course due to the penetration of the electron beam, and the fairly uniform heating through the thickness of the film. Because the interlayer growth is in an activated process, it is only significant in those regions reaching temperatures greater than ~800° K.

The local contraction of the multilayer period produces an indentation in the film in the vicinity of the electron beam. The structural deformation in the Mo/Si multilayer film resulting from a 10 ms exposure (I=3 $\nabla$A, V=10 kV) is shown in FIG. 2. Although the depression at the surface is 12 nm deep, the contraction of each multilayer period, $\Delta\Lambda$, is less than 0.5 nm. Consequently the primary effect of such a deformation on the EUV reflectivity of the multilayer film will be to cause a local phase perturbation. For larger deformations there will also be a decrease in the reflectivity due to the decrease in contrast at the multilayer interfaces. Note also that the lateral width of the deformation is contained within the region of the electron beam. The depth of the deformation is most easily controlled by adjusting the exposure time. Again, this is shown in FIG. 3, where the profile of the top surface of the film is plotted for exposure times of 1, 3 and 10 ms. It is apparent that by adjusting the exposure time and the footprint, the detailed shape of the deformation and the corresponding phase shift can be accurately controlled.

These results show that an electron beam of moderate voltage (~10 kV) can be used to contract the period of a Mo/Si reflective coating within a small spot defined basically by the footprint of the beam. (For Mo/Si, the key physical requirement on the energy deposition is the spatial resolution, i.e., small spot size, and energy sufficient to raise the temperature by hundreds of degrees. In the case of Mo/Si this works out to a deposited power in the range of 1–100 mW.) The contraction of the period, due to thermally activated silicide formation at the multilayer interfaces, occurs through approximately half the thickness of the film (20 periods). This produces a controllable indentation at the top surface having a depth that can exceed 10 nm Since the film contraction generated by the electron beam is distributed over many periods, the primary effect of the deformation on the EUV reflectivity is a local phase shift of the reflected field. Bumps due to coating over particles can be repaired by directly writing on top of them to shrink the film back to its correct position. Indentations due to coating over pits and scratches could be repaired by contracting the film at the edges and thereby smooth out the defect to mitigate the phase contrast. In fact, it might indeed be possible to use this technique to repair the Mo/Si multilayer film underneath an existing metal absorber layer, since the metal layer should not be affected by exposure to these temperatures.

The requirements of microamps of current at 10 kV are difficult to achieve within a spot size of ~50 nm. One solution is to use field emission from a carbon nanotube. These nanotubes are typically tens of nanometers in diameter and are stable, high current field emitters capable of delivering microamps of current (See A. G. Rinzler, J. H. Hafner, P. Nikolaev, L. Lou, S. G. Kim, D Tomanek, P. Nordlander, D. T. Colbert and R. E. Smalley, "Unraveling Nanotubes: Field Emission from an Atomic Wire", Science 269,1550 (1995) incorporated herein by reference. The nanotube could be integrated into the head of a scanning probe microscope, and proximity focusing could be used to steer the extracted current into a small spot on the surface of the film. The scanning probe microscope would be used to locate and monitor the repair of the mask defect. Examples of carbon nanotubes are described in copending US. patent application Ser. No. 09/669,948 titled "A High-Current, High-Voltage, Small Diameter Electron Beam Source Obtained By Field Emission From, And Used In Close Proximity To, A Single Carbon Nanotube" filed on the same day as the present application and incorporated herein by reference.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

We claim:

1. A method for mitigating multilayer defects on a reticle for use in an extreme ultraviolet lithography (EUVL) system, comprising:

providing a reflective EUVL reticle that includes a substrate with a thin film coating that has a defect; and changing the thickness of said thin film coating in the vicinity of said defect.

2. The method of claim 1, wherein said thin film coating comprises a multilayer coating having multiple layer boundaries, wherein the step of changing the thickness of said thin film coating in the vicinity of said defect includes interdiffusing at least one layer boundary of said layer boundaries.

3. The method of claim 2, wherein the step of interdiffusing at least one layer boundary includes controlling the multilayer contraction associated with the densification that occurs upon interdiffusion at said at least one layer boundary.

4. The method of claim 3, wherein the step of controlling the multilayer contraction includes activating the step of interdiffusing using a localized energy source.

5. The method of claim 4, wherein said localized energy source comprises an electron beam.

6. The method of claim 5, wherein said electron beam is focused.

7. The method of claim 4, wherein said localized energy source is selected from the group consisting of an electromagnetic beam, an electron beam and an ion beam.

8. The method of claim 7, wherein said localized energy source is focused.

9. The method of claim 7, further comprising controlling the decrease in thickness of said multilayer coating by adjusting the energy dose of said localized energy source.

10. The method of claim 7, further comprising adjusting the energy dose of said localized energy source to control the decrease in film thickness with sub-nanometer accuracy.

11. The method of claim 7, further comprising controlling the lateral spatial resolution of the localization of energy deposition produced by said localized energy source.

12. The method of claim 7, wherein the depth of the deformation is controlled by adjusting the exposure time of said localized energy source.

13. The method of claim 4, wherein said localized energy source comprises an electrode.

14. The method of claim 3, wherein said densification comprises silicide formation.

15. The method of claim 1, wherein said thin film coating comprises a multilayer coating having multiple layer boundaries, wherein the step of changing the thickness of said coating in the vicinity of said defect includes altering the density of at least one layer of said multilayer coating.

16. The method of claim 1, wherein said thin film coating comprises a multilayer coating having multiple layer boundaries, wherein the step of changing the thickness of said thin film coating in the vicinity of said defect includes interdiffusing a plurality of said layer boundaries.

17. The method of claim 1, wherein said defect comprises a mound or protrusion caused by multilayer deposition over a particle, wherein said defect is mitigated by decreasing the multilayer film thickness at the position of said defect, or spreading the sides of said mound, thereby reducing the slopes of said defect.

18. The method of claim 1, wherein said defect comprises a depression caused by multilayer deposition over a pit or scratch, wherein said defect is mitigated by increasing the multilayer film thickness at the position of the said defect, or spreading the sides of said depression, thereby reducing the slopes of said defect.

19. The method of claim 1, wherein said thin film coating comprises a reflective multilayer structure.

20. The method of claim 1, wherein said multilayer coating is used as a buffer layer, wherein said EUVL reticle further comprises a reflective multilayer coating deposited on said multilayer coating.

21. The method of claim 1, wherein said multilayer coating comprises Mo/Si.

* * * * *